United States Patent
Nemati et al.

(10) Patent No.: US 6,785,169 B1
(45) Date of Patent: Aug. 31, 2004

(54) MEMORY CELL ERROR RECOVERY

(75) Inventors: Farid Nemati, Menlo Park, CA (US); Mahmood Reza Kasnavi, Palo Alto, CA (US); Robert Homan Igehy, Los Altos, CA (US)

(73) Assignee: T-Ram, Inc.

( * ) Notice: Subject to any disclaimer, the term of this patent is extended or adjusted under 35 U.S.C. 154(b) by 0 days.

(21) Appl. No.: 10/117,596

(22) Filed: Apr. 5, 2002

(51) Int. Cl.$^7$ .............................................. G11C 7/00

(52) U.S. Cl. .................. 365/189.07; 365/200; 365/210; 365/185.21

(58) Field of Search ........................... 365/189.07, 200, 365/210, 185.21

(56) References Cited

U.S. PATENT DOCUMENTS

| | | | | |
|---|---|---|---|---|
| 4,942,556 A | * | 7/1990 | Sasaki et al. ................ | 365/200 |
| 5,048,023 A | * | 9/1991 | Buehler et al. ................ | 371/40 |
| 5,307,142 A | | 4/1994 | Corbett et al. | |
| 5,383,151 A | * | 1/1995 | Onishi et al. ................ | 365/149 |
| 5,787,038 A | * | 7/1998 | Park ....................... | 365/185.22 |
| 6,067,656 A | * | 5/2000 | Rusu et al. .................. | 714/768 |
| 6,229,161 B1 | | 5/2001 | Nemati et al. | |

OTHER PUBLICATIONS

"Neutron–induced boron fission as a major source of soft errors in deep submicron SRAM Devices," R. C. Baumann and E.B Smith, IRPS (IEEE).
"Modeling of alpha–particle–induced soft error rate in DRAM," H. Shin, IEEE Trans. Elec. Dev., vol 46 No. 9.
"Geometric effect of multiple–bit soft error rates induced by cosmic ray neutrons on DRAM's," S. Satoh, Y. Tosaka, and S.A. Wender, IEEE Trans. Elec. Dev., vol 21 No. 6.
"Boron as a primary source of radiation in high density DRAM's" R. Baumann, T. Hossain, E. Smith, S. Muratat, and H. Kitagawa, VLSI Tech. Symp.
Accurate, Predictive modeling of soft error rate due to cosmic rays and chip alpha radiation,: G.R. Srinivasan, P.C. Murley, and H.K. Tang. IRPS (IEEE).
"Measurement and analysis of neutron–induced soft errors in sub–half–micron CMOS circuits," Y. Tosaka, S. Satoh, T. Itakura, H. Ehara, T. Ueda, G. Woffinden, and S. Wender, IEEE Trans. Elec. Dev.
"SOI Circuit Design Concepts," K. Bernstein and N.J. Rohrer, Kluwer Academic Publishers, p. 141.
"Numerical analysis of alpha–particle–induced soft errors in SOI MOS devices," H. Iwata and T. Ohzone, IEEE Trans. Elec. Dev., vol 39 No. 5.
A soft error immune 0.35 $\mu$m PD–SOI SRAM technology compatible with bulk CMOS, T. Ikeda. S. Wakahara, Y. Tamaki, and H. Higuchi, IEEE International SOI Conf.

(List continued on next page.)

*Primary Examiner*—Connie C. Yoha

(57) ABSTRACT

The soft error rate in a semiconductor memory is improved via the use of a circuit and arrangement adapted to use a mirror bit to recover from a soft error. According to an example embodiment of the present invention, a semiconductor device includes first and mirror memory cells configured and arranged to receive and store a same bit in response to a write operation, with the memory cells more susceptible to a bit error in which the stored bit changes from a first state to a second state than to a change from the second state into the first state. The memory cells are separated by a distance that is sufficient to make the likelihood of both memory cells being upset by a same source very low. For a read operation, the bits stored at the fist and second memory cells are compared. If the bits are the same, the bit from the first and/or mirror bit is read out, and if the bits are different, a bit corresponding to the more susceptible state is read out. In this manner, soft errors can be overcome.

12 Claims, 4 Drawing Sheets

OTHER PUBLICATIONS

"α–particle–induced soft errors in submicron SOI SRAM," Y. Tosaka, K. Suzuki, and T. Sugii, IEEE VLSI Tech. Symp.

"A 128Kb SRAm with Soft Error Immunity for 0.35 um SOI–CMOS embedded cell arrays," Y. Wada et al., IEEE International SOI Conf.

H.T. Weaver, W. T. Corbett and J. M. Pimbley, "Soft Error Protection Using Asymmetric Response Latches", IEEE Trans. on Electron Devices, vol. 38, No. 6, Jun. 1991, pp 1555–1557.

* cited by examiner

MEMORY CELL ERROR RECOVERY

FIELD OF THE INVENTION

The present invention is directed to semiconductor devices and, more specifically, to semiconductor devices relating to memory applications susceptible to errors including soft errors.

BACKGROUND

In a variety of memory applications, such as SRAM, DRAM, non-volatile memory, thin capacitively coupled thyristor (TCCT) applications, other RAM applications and other memory applications such as CAM, dual-port, FTFO, etc., circuitry used to stare data can experience conditions that result in the stored data being corrupted. Errors common to memory cells include one or more cells sticking at a particular value (e.g. stuck-at-1), a write-zero pulse not being wide enough for a particular bit, a read-one circuit noise margin not being enough, and others. One particular type of error that has presented challenges to memory applications is a soft error. Soft errors occur when data stored in a memory cell is upset in a non-permanent manner, such as when stored data is changed to an incorrect value by a particle interaction. For example, the value of a memory cell may be changed from a "1" to a "0" value or from a "0" to a "1" value. These changes can result in incorrect data and inhibit the performance of memory cells.

The rate at which soft errors occur is referred to as the soft error rate, or SER. The SER can be calculated empirically, or else by first simulating the charge created at each node, and then simulating the device behavior to find the charge distribution conditions that lead to a soft error. The spectrum of each node that can result in a charge that causes an error is found, and the fluxes of the relevant parts of each spectrum are integrated to find the total flux and the probability of a bit error. Assuming the errors are probabilistically independent (which is not always the case), the resulting probability of failure can be represented by the equation:

$$N_{bit} \times P_{1\text{-}bit}$$

where $N_{bit}$ is the number of bits in the device and $P_{1\text{-}bit}$ is the probability related to the failure of a bit.

A variety of sources, such as alpha particles, cosmic rays, high-energy, and thermal neutrons, can cause soft errors. These sources can be generated in a variety of manners. For instance, alpha particles may be generated by contamination in metal layers, ceramic portions, and solder contacts of an integrated circuit die, and they generally create a small charge (e.g., 15 fC/micron) and a relatively high flux (e.g., 0.001–0.002/h-cm$^2$). Cosmic background radiation, such as background radiation generated at sea level, generates cosmic rays that typically exhibit a relatively low flux and a relatively high charge. Thermal neutrons, which include very low energy cosmic background neutrons, generally exhibit a relatively high flux and a moderate charge and cause fission in borophosphosilicate gas (BPSG) films.

Memory cells typically exhibit a critical charge, or Qcrit, at which a soft error will occur (ie., a charge that will upset the cell). The charge created by these and other sources can be collected in a portion of the cell and when the collected charge (Qcollected) exceeds Qcrit, a soft error occurs.

If BPSG is used, the SER is typically dominated by fission. However, in many modem applications, and particularly in DRAM applications, BPSG is reduced or eliminated. In the absence of BPSG and where Qcrit is high the SER is dominated by cosmic rays because they generate a relatively large amount of charge. In applications where BPSG is absent and Qcrit is low, alpha particles dominate the SER.

Qcrit for flipping a "0" to a "1" is approximately the same as Qcrit for flipping a "1" to a "0" in symmetric memory cells such as 6-transistor SRAM. However, in asymmetric memory cells, Qcrit01 (Qcrit to flip a bit from "0" to "1") is very different from Qcrit10 (Qcrit to flip a bit from a "1" to "0"). For example, in TCCT base memory cells the Qcrit01 is significantly less than Qcrit10, and, a soft error detection and correction method which assumes that all soft errors are "0" to "1" flips can be used.

In each of the above and in other applications, SER and other error rates continue to present challenges to the continued advancement of the semiconductor industry.

SUMMARY

The present invention is directed to overcoming the above-mentioned challenges and others related to the types of devices and applications discussed above and in other memory cells. The present invention is exemplified in a number of implementations and applications, some of which are summarized below.

According to an example embodiment of the present invention, a memory arrangement is adapted for error recovery using first and second (mirror) bits. The memory arrangement includes a first asymmetric memory cell and a mirror asymmetric memory cell, each asymmetric memory cell being adapted to receive and store a same bit in response to a write operation. An output circuit detects and compares the bits stored at the first and mirror asymmetric memory cells. An error is detected when the bits stored at the first and mirror cells are different (e.g., when one of the cells has been upset by an error, such as excess charge near the cell). In response to detecting an error on either the first or the mirror cell, the output circuit is adapted to provide an output corresponding to the bit received and stored. In one implementation, this detection and correction scheme involves performing a logical AND operation between the first cell and the mirror cell in the case that errors are presumed to flip a "0" into a "1" only, and in the case that errors are presumed to flip a "1" into a "0" only, a logical OR operation is performed between the first cell and the mirror cell. This scheme is able to detect and correct an error to either one of the first cell or the mirror cell.

In another example embodiment, the present invention is directed to a method for recovering from errors in a memory arrangement having first and mirror asymmetric memory words, each word comprising one or more cells. During a write cycle, bits provided (written) to the first asymmetric memory word are also provided to the mirror asymmetric memory word. Between consecutive write cycles, memory cells from each word can become upset. The bits stored at each memory cell are compared for a read operation, and when the values stored at the first and mirror memory cells are different, a bit corresponding to the received and stored bit at the first asymmetric memory word is read out. In one implementation, this detection and correction scheme involves performing a logical AND operation between the first word and the mirror word in the case that errors are presumed to flip a "0" into a "1" only, and in the case that errors are presumed to flip a "1" into a "0" only, a logical OR operation is performed between the first word and the mirror word. This scheme is able to detect and correct all errors in which either one or none of any two corresponding memory cells in the first word and mirror word have an error.

The above summary of the present invention is not intended to describe each illustrated embodiment or every implementation of the present invention. The figures and detailed description that follow more particularly exemplify these embodiments.

BRIRF DESCRIPTION OF THE DRAWINGS

The invention may be more completely understood in consideration of the detailed description of various embodiments of the invention in connection with the accompanying drawings, in which.

Figure 1:
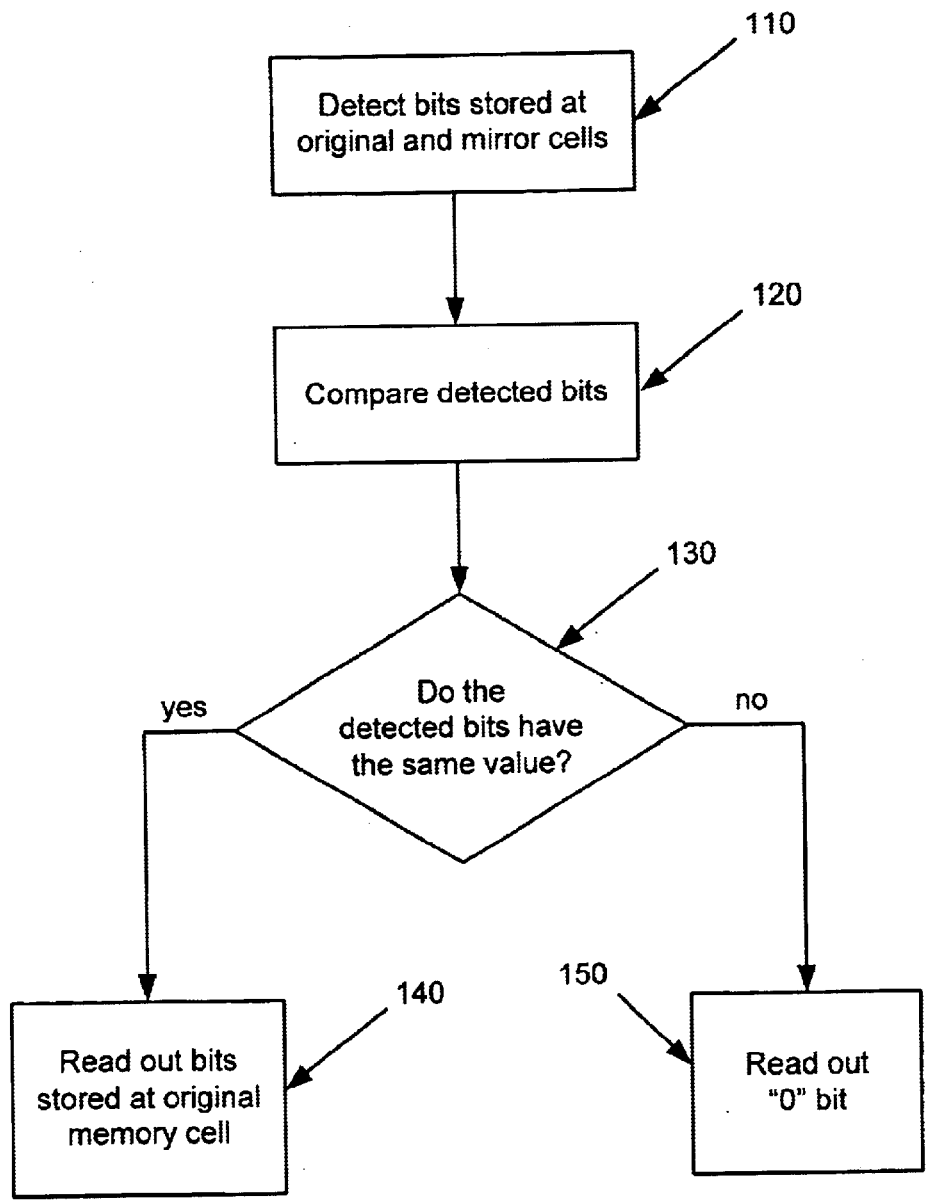
FIG. 1 is a flow diagram for error recovery in a memory cell, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of memory applications, and has been found to be particularly useful for devices susceptible to errors including soft errors. While the present invention is not necessarily limited to such devices, various aspects of the invention may be appreciated through a discussion of various examples using this context.

According to an example embodiment of the present invention, a memory arrangement is adapted for error recovery using a comparison of bits stored at first and second memory cells (e.g., DRAM, SRAM, non-volatile memory or TCCT memory cells). The bits are sufficiently separated such that the likelihood of both bits becoming upset in response to a single error source (e.g., static charge) is relatively low. Each of the first and second memory cells receives and stores a bit received from a same source during a write cycle, and the bit value at each cell is detected and compared for a subsequent read cycle. If the bits are the same, the value of the first (or second) bit is read out. If the bits are different, an output corresponding to the bit originally received and stored at the first (and second) memory cell is provided. In one particular implementation, the memory arrangement is adapted to output a "0" whenever the bits are different. In this manner, errors causing a memory cells to be upset (e.g., switched from a "0" to a "1") can be recovered from by detecting whether or not the values of the cells are different. This method works for a variety of memory cells, including those that can easily be switched from a "0" to a "1" (small Qcrit for "0" to "1") but cannot be easily be switched from a "1" to a "0" (large Qcrit for "1" to "0") by an error. For example, TCCT based memory cells have an asymmetric sensitivity (different Qcrit) for flipping between "0" and "1" states.

FIG. 1 is a flow diagram for error recovery in an asymmetric memory cell that can easily be switched by an error from a "0" to a "1", but not vice versa, according to another example embodiment of the present invention. At block 110, bits stored at original and mirror TCCT memory cells are detected, and the detected bits are compared at block 120. If the comparison indicates that the detected bits have the same value at block 130, an output corresponding to the bit stored at the original memory cell is read out at block 140. If the comparison indicates that the detected bits do not have the same value at block 130, a "0" bit is read out at block 150. In this instance, if the bit originally received and stored at the first memory cell is a "0" and has not been upset, the output being "0" corresponds correctly to the bit. Accordingly, if the bit originally received and stored at the first memory cell has been upset and is a "1," the output being "0" corresponds correctly to the bit received and stored at the first memory cell, prior to being upset. This is particularly useful in TCCT applications where errors (bit upsets) cause a bit to change from a "0" to a "1" value, and not from a "1" to a "0" value.

Figure 2:
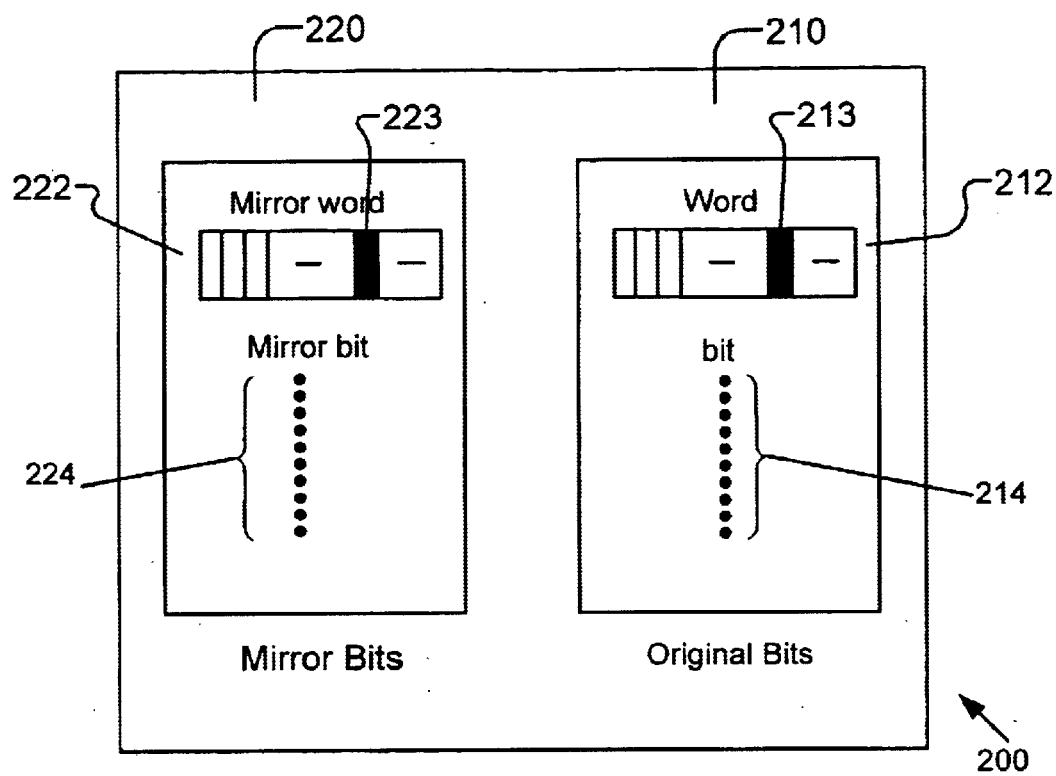
FIG. 2 shows a series of original and mirror bits, used in connection with another example embodiment of the present invention.

The present invention is applicable to a variety of semiconductor circuit arrangements and memory applications. FIG. 2 is a schematic of one such circuit arrangement 200 having a series of original words 210 and mirror words 220 (e.g., respective memory arrays), each word including original and mirror bits that are a part of a series of bits 214 and 224, respectively. Using word 212 and mirror word 223 in an example, bit 213 is compared to bit 223 using comparison circuitry. If the comparison shows that the bits are equal, no error has been detected and an output (a "1" or "0") corresponding to bit 213 is read out. However, if the comparison shows that the bits are not equal, an error has been detected and a "0" is output.

In a more particular example embodiment, the mirror words 220 are adapted to store values that are different than the values stored in the original words 210. This is particularly useful in applications where error recovery is not necessary at all times and/or for all bits. For example, it may be useful to use all bits for memory storage in a particular application. It may also be useful to selectively apply an error recovery scheme to some of the bits in a memory array, but not for others. In this instance, mirrored data is stored in the mirror bits only for those bits to which error recovery is applied, and the remaining mirror bits are used to store information. This is particularly useful for increasing the memory storage capability of the circuit arrangement 200 while maintaining error recovery for selected bits.

Figure 3:
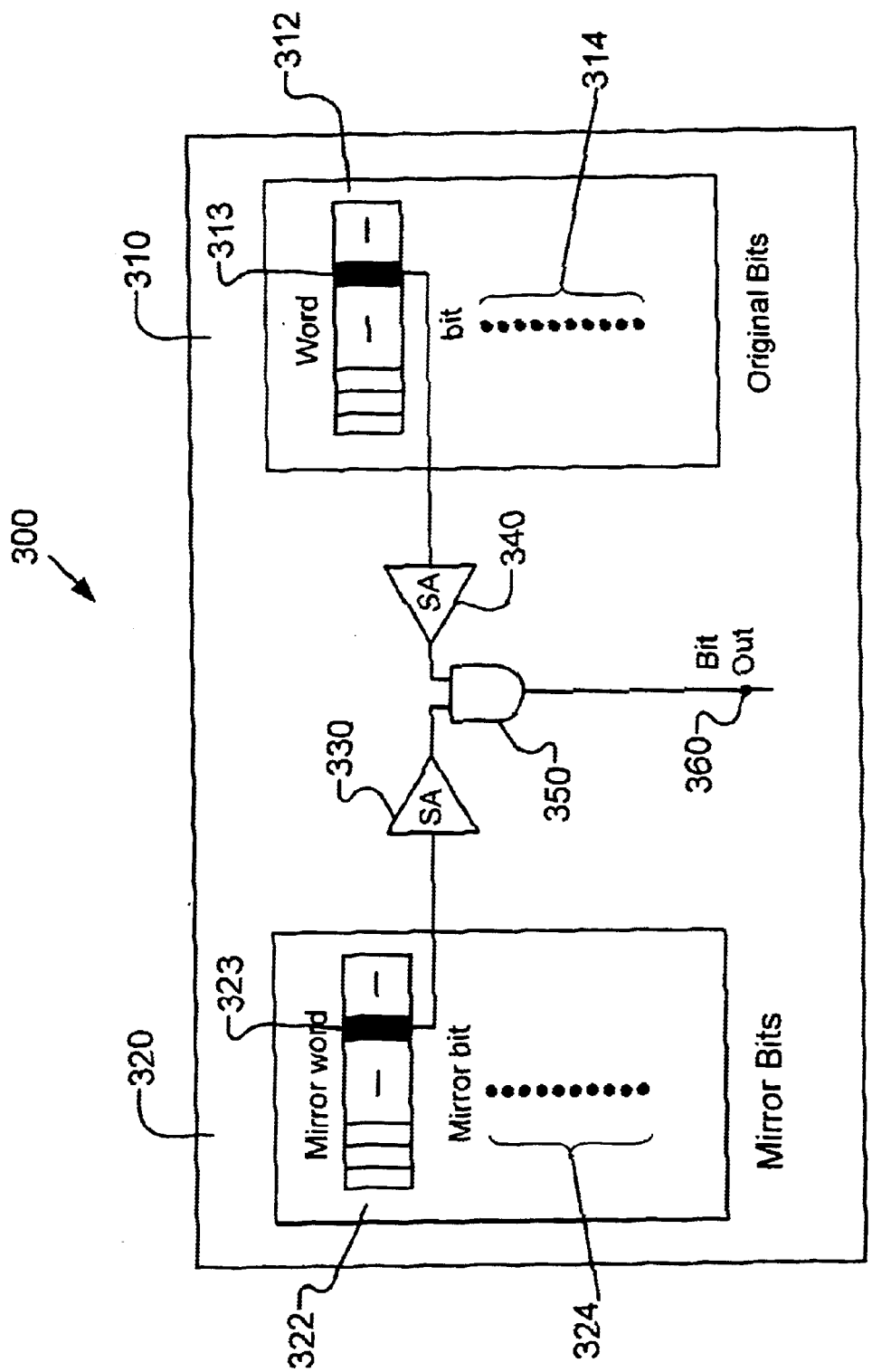
FIG. 3 is a circuit configured and arranged for error recovery, according to another example embodiment of the present invention.

FIG. 3 is an arrangement of original and mirror words 310 and 320, respectively, and circuitry adapted to detect and compare original and mirror bits, according to another example embodiment of the present invention. Each arrangement of original and mirror words includes a series of original and mirror bits 314 and 324, respectively. Referring to original and mirror words 312 and 322 as an example, original bit 313 is electrically coupled to a first sense amplifier 340, and mirror bit 323 is electrically coupled to a second sense amplifier 330. The sense amplifiers are electrically coupled to an AND gate 350 adapted for comparing the signals from the sense amplifiers. If the original bit and the mirror bit have the same value, the AND gate reads out the value of the original bit at node 360. However, when the original bit and the mirror bit are different, a "0" is read as the bit out. In one implementation, the bit out value at node 360 is defined as BIT OUT=(bit) AND (mirror bit),
where the value "bit" is the output from sense amplifier 340 and the value "mirror bit" is the output from sense amplifier 330.

The original bits (313, 314) are separated from their corresponding mirror bits (323, 324) by a distance that is sufficient to inhibit the possibility of an original bit and its mirror bit being upset by a single source, such as an alpha particle or other excess charge. In one implementation, original bit 313 is separated from mirror bit 323 by more than about one micron, and in another implementation the original and corresponding mirror bits are separated by more than about ten microns. Moreover, in applications where sources of error exhibit a relatively strong charge and/or flux, the separation of the original and mirror bits is selectively increased to achieve an acceptable probability that a single source would upset both the original and mirror bits.

In another example embodiment of the present invention, the circuitry including the AND gate 350 and the sense amplifiers 330 and 340 is replaced by a different comparison circuit adapted for comparing the values of the original and mirror bits. The comparison circuit is electrically coupled to the bits 313 and 323 and adapted to compare their values. As with the AND gate in FIG. 3, the comparison circuit is adapted to read out the value of the original bit when the original and mirror bits are the same, and to read out a "0" when the original and mirror bits are different. In other implementations, logic operator circuits including circuitry such as an OR gate, an inverter and/or other commonly available circuitry are used to effect the comparison.

Figure 4:
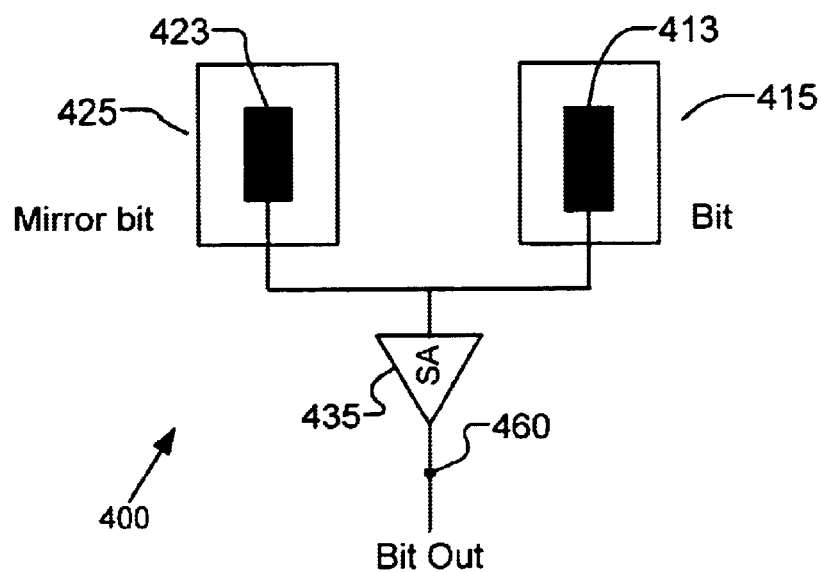
FIG. 4 is another circuit configured and arranged for error recovery, according to another example embodiment of the present invention.

FIG. 4 is an error recovery arrangement 400 having original and mirror bits 413 and 423 located in isolated active regions 415 and 425, respectively. The read current from the bits when one bit is on and the other is off (e.g., one bit is "1" and the other bit is "0") is referred to as $I_{cell}$, and the read current when both bits are on is thus about $2 \times I_{cell}$. Therefore, when the bits are different, the read current is equal to about $I_{cell}$, and when both bits are "1" the read current is about $2 \times I_{cell}$. In this regard, the bits are electrically coupled to a sense amplifier 435 that is adapted to read a "0" bit out at node 460 in response read current being less than about $2 \times I_{cell}$. This effects a proper read out because either there has been an error, in which a "0" should be read out, or there has been no error and the value of both of the bits is "0" (and thus $I_{cell}$ is about zero). Accordingly, a "1" bit is read out in response to the read current being about $2 \times I_{cell}$.

Figure 5:
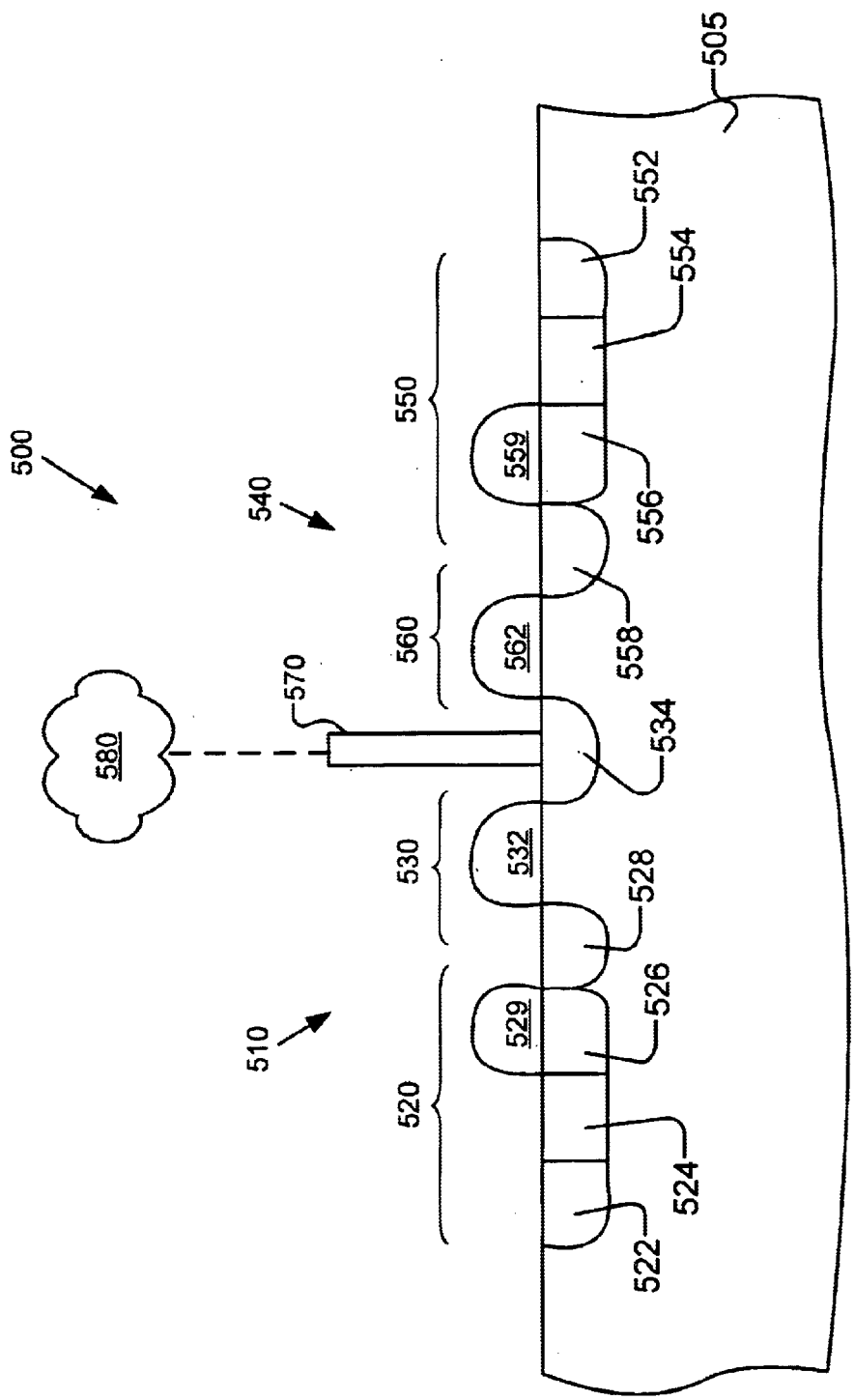
FIG. 5 is a thyristor-based memory cell arrangement adapted for error recovery, according to another example embodiment of the present invention.

The error recovery scheme of the present invention is adaptable for implementation with a variety of memory cell arrangements. FIG. 5 shows one such memory arrangement 500 including thyristor-based memory cells 510 and 540 in a substrate 505, each having a thyristors 520 and 550 electrically coupled in series with pass gates 530 and 560, respectively. The thyristor 520 includes emitters 522 and 528 separated by base regions 524 and 526, and a gate 530 capacitively coupled to base region 526. The gate 529 is electrically coupled to a second word line (WL2) and adapted to form a conductive channel between the emitters 522 and 528 via the base regions 524 and 526 in response to a voltage being applied to WL2. Emitter region 528 is also a source/drain region for the pass gate 530 and is adapted to store a bit. The pass gate 530 also includes source/drain region 534 and a gate 532 electrically coupled to a first word line (WL1). The pass gate is adapted to form a conductive channel between the source/drain regions 528 and 534 in response to a voltage being applied to WL1. A bitline 570 is coupled to the source/drain region 534 and adapted for reading out the bit from the emitter region 528.

Memory cell 540 has similar features to memory cell 510 and is similarly numbered, and the discussion above regarding memory cell 510 also applies to memory cell 540. In addition, gate 562 is also electrically coupled to WL1, and gate 559 is also electrically coupled to WL2. The bitline 570 is electrically coupled to a comparison circuit 580, such as the one shown in FIG. 4, that is adapted to detect that the bits stored in each memory cell are different. The comparison circuit is adapted to read out a "0" value when the bits are different and to read out the value stored at the bits when they are the same.

The memory arrangement 500 in FIG. 5 shows both memory cells sharing bitline 570 and source/drain region 534, as would be applicable to the circuit arrangement shown in FIG. 4. However, in another example embodiment, separate bitlines are used (e.g. as would be applied to FIG. 3) with similar cells, except wherein the separate bitlines are electrically coupled to separate source/drain regions of the respective pass gates and to the comparison circuit 580.

The various embodiments described above are provided by way of illustration only and should not be construed to limit the above invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated words, bits and the thyristors and connections to which they may be applied; adding structures to the semiconductor devices; using asymmetric memory cells other than TCCT memory cells (e.g., SRAM, DRAM, non-volatile memories); using asymmetric memory cells that are easily disturbed and flipped from a "1" to a "0", but not vice versa, with the corresponding logic (e.g., a OR gate or other circuitry that achieves the same logic, such as sensing circuitry that is wired to both the first and mirror cells and outputs a "1" when the read current is equal to or greater than approximately $I_{cell}$, and outputs a "0" when the read current is less than approximately $I_{cell}$); using an inverter that changes a signal from a "1" to a "0" and vice versa, wherein the error detection schemes described herein are correspondingly reversed to correspond to the inverted signals (e.g., susceptibility of a flip from a "0" to a "1," after inversion, corresponds to the susceptibility of a flip from a "1" to a "0"); increasing the number of PN sections in thyristors of the memory cells; interchanging P and N regions in the device structures and/or using PMOSFETS interchangeably with NMOSFETS. In addition, for more information regarding TCCT implementations to which the present invention is applicable, reference may be made to U.S. Pat. No. 6,229,161, dated May 8, 2001 and entitled "Semiconductor Capacitively-Coupled NDR Device And Its Applications In High-Density High-Speed Memories And In Power Switches," which is fully incorporated herein by reference. Such modifications and changes do not depart from the true spirit and scope of the present invention that is set forth in the following claims.

What is claimed is:

1. A semiconductor device comprising:
   a first memory cell and a mirror memory cell, each of the memory cells being adapted to receive and store the same bit in response to a write operation and at least one of the memory cells being more susceptible to a bit error in which the stored bit changes from a first state to a second state than to a bit error in which the stored bit changes from the second state into the first state; and a sense amplifier electrically coupled to the first and mirror memory cells and adapted to provide an output of a "0" in response to a read current from the memory cells being less than the read current corresponding to approximately twice the read current corresponding to a single bit when the cell is on and to provide an output of a "1" when said read current is egual to approximately twice a read current corresponding to a single bit when the cell is on.

2. A memory arrangement comprising:

a first memory cell and a mirror memory cell, each of the memory cells being adapted to receive and store the same bit in response to a write operation and at least one of the memory cells being more susceptible to a bit error in which the stored bit changes from a first state to a second state than to a bit error in which the stored bit changes from the second state into the first state; and a sense amplifier electrically coupled to the first and mirror memory cells and adapted to provide an output of a "0" in response to a read current from the memory cells being less than the read current corresponding to a single bit when the cell is on and to provide an output of a "1" when said read current is greater than or equal to the read current corresponding to a single bit when the cell is on.

3. The semiconductor device of claim 1, wherein the first memory cell is separated from the mirror memory cell by a distance that is sufficient to inhibit both cells from being simultaneously upset by a single error source.

4. The semiconductor device of claim 3, wherein the first and mirror memory cells are separated by at least one micron.

5. The semiconductor device of claim 3, wherein the first and mirror memory cells are separated by at least ten microns.

6. The semiconductor device of claim 1, wherein the first and mirror memory cells comprise at least one of: an SRAM memory cell, a DRAM memory cell, a non-volatile memory cell, and a TCCT memory cell.

7. The semiconductor device of claim 1, wherein the first memory cell and the mirror memory cell are each in separate active regions isolated from one another.

8. The semiconductor device of claim 1, wherein the first memory cell and the mirror memory cell are adaptable for use as separate memory cells wherein the mirror memory cell is adaptable for receiving and storing a different bit than the bit received and stored by the first memory cell.

9. A semiconductor memory array comprising a plurality of memory cell arrangements and adapted for read and write access, each of the plurality of memory cell arrangements comprising:

a first memory cell and a mirror memory cell, each of the memory cells being adapted to receive and store the same bit in response to a write operation and at least one of the memory cells being more susceptible to a bit error in which the stored bit changes from a first state to a second state than to a bit error in which the stored bit changes from the second state into the first state; and sense amplifier electrically coupled to the first and mirror memory cells and adapted to provide an output of a "0" in response to a read current from the memory cells being less than the read current corresponding to approximately twice a read current corresponding to a single bit when the cell is on and to provide an output of a "1" when said read current is equal to approximately twice a read current corresponding to a single bit when the cell is on.

10. The semiconductor memory array of claim 9, wherein the first and mirror memory cells share a bitline.

11. The semiconductor memory array of claim 9, wherein the first and mirror memory cells use separate bitlines.

12. A semiconductor memory array comprising a plurality of memory cell arrangements and adapted for read and write access, each of the plurality of memory cell arrangements comprising:

a first memory cell and a mirror memory cell, each of the memory cells being adapted to receive and store the same bit in response to a write operation and at least one of the memory cells being more susceptible to a bit error in which the stored bit changes from a first state to a second state than to a bit error in which the stored bit changes from the second state into the first state; and a sense amplifier electrically coupled to the first and mirror memory cells and adapted to provide an output of a "0" in response to a read current from the memory cells being less than a read current corresponding to a single bit when the cell is on and to provide an output of a "1" when said read current is greater than or equal to a read current corresponding to a single bit when the cell is on.

* * * * *